United States Patent
Gu et al.

(10) Patent No.: US 10,879,385 B2
(45) Date of Patent: Dec. 29, 2020

(54) DEVICE INTEGRATED WITH JUNCTION FIELD EFFECT TRANSISTOR AND METHOD FOR MANUFACTURING THE SAME

(71) Applicant: CSMC TECHNOLOGIES FAB2 CO., LTD., Jiangsu (CN)

(72) Inventors: Yan Gu, Jiangsu (CN); Shikang Cheng, Jiangsu (CN); Sen Zhang, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/329,413

(22) PCT Filed: Aug. 31, 2017

(86) PCT No.: PCT/CN2017/099860
§ 371 (c)(1),
(2) Date: Feb. 28, 2019

(87) PCT Pub. No.: WO2018/041208
PCT Pub. Date: Mar. 8, 2018

(65) Prior Publication Data
US 2019/0252537 A1    Aug. 15, 2019

(30) Foreign Application Priority Data
Aug. 31, 2016   (CN) .......................... 2016 1 0793832

(51) Int. Cl.
*H01L 29/78* (2006.01)
*H01L 27/02* (2006.01)
(Continued)

(52) U.S. Cl.
CPC .......... *H01L 29/7803* (2013.01); *H01L 27/02* (2013.01); *H01L 27/06* (2013.01);
(Continued)

(58) Field of Classification Search
CPC ..... H01L 29/7803; H01L 27/02; H01L 29/06; H01L 27/06; H01L 27/098;
(Continued)

(56) References Cited

U.S. PATENT DOCUMENTS

| 5,136,349 A | 8/1992 | Yilmaz et al. |
| 6,323,518 B1 | 11/2001 | Sakamoto et al. |

(Continued)

FOREIGN PATENT DOCUMENTS

| CN | 101026190 A | 8/2007 |
| CN | 101127327 A | 2/2008 |

(Continued)

OTHER PUBLICATIONS

International Search Report dated Nov. 22, 2017 in the parent application PCT/CN2017/099860. 4 pages.

(Continued)

*Primary Examiner* — Tucker J Wright
(74) *Attorney, Agent, or Firm* — Polsinelli PC

(57) ABSTRACT

A device integrated with a junction field-effect transistor, the device is divided into a JFET region and a power device area, and the device includes: a drain (201) having a first conduction type; and a first conduction type region (214) disposed on a front face of the drain; the JFET region further includes: a JFET source (208) having a first conduction type; a first well (202) having a second conduction type; a metal electrode (212) formed on the JFET source (208), which is in contact with the JFET source (208); a JFET metal gate (213) disposed on the first well (202) at both sides of the JFET source (208); and a first clamping region (210) located below the JFET metal gate (213) and within the first well (202).

11 Claims, 6 Drawing Sheets

(51) Int. Cl.
  *H01L 29/06* (2006.01)
  *H01L 27/06* (2006.01)
  *H01L 27/098* (2006.01)
  *H01L 29/66* (2006.01)

(52) U.S. Cl.
  CPC ............ *H01L 27/098* (2013.01); *H01L 29/06* (2013.01); *H01L 29/66712* (2013.01)

(58) Field of Classification Search
  CPC .......... H01L 29/66712; H01L 29/1095; H01L 29/41766; H01L 29/66909; H01L 29/1066; H01L 29/42316; H01L 29/7802; H01L 29/8083; H01L 27/085; H01L 27/0207; H01L 27/0617; H01L 29/0603; H01L 29/0684; H01L 29/1058; H01L 29/66893–66924; H01L 29/8086; H01L 2924/13062; H01L 27/14679; H01L 29/04–045; H01L 29/16–1608; H01L 29/18–185; H01L 29/22–2206; H01L 29/36–365
  See application file for complete search history.

(56) References Cited

U.S. PATENT DOCUMENTS

| | | |
|---|---|---|
| 2011/0180858 A1 | 7/2011 | Chiang et al. |
| 2013/0082320 A1 | 4/2013 | Alberhasky et al. |
| 2013/0082321 A1* | 4/2013 | Sobti ................ H01L 29/42368 257/329 |
| 2014/0117415 A1 | 5/2014 | Ma et al. |
| 2014/0231883 A1 | 8/2014 | Esteve et al. |
| 2015/0333748 A1 | 11/2015 | Toyoda |

FOREIGN PATENT DOCUMENTS

| | | |
|---|---|---|
| CN | 101404292 A | 4/2009 |
| CN | 102034820 A | 4/2011 |
| CN | 102037562 A | 4/2011 |
| CN | 203644787 U | 6/2014 |
| CN | 104009088 A | 8/2014 |
| EP | 1 058 303 A1 | 12/2000 |
| JP | S 63-266882 A | 11/1988 |
| JP | 2002-185013 A | 6/2002 |

OTHER PUBLICATIONS

Office Action dated Aug. 16, 2019, issued in corresponding Chinese Patent Application No. 201610793832.2 (6 pages).
Search Report dated Jan. 7, 2020, issued in European Patent Application No. 17845510.1 (9 pages).
Office Action dated Jul. 28, 2020, issued in corresponding Japanese Patent Application No. 2019-511876 (4 pages).

* cited by examiner

DEVICE INTEGRATED WITH JUNCTION FIELD EFFECT TRANSISTOR AND METHOD FOR MANUFACTURING THE SAME

CROSS REFERENCE TO RELATED APPLICATIONS

This application is a National Phase filing under 35 U.S.C. § 371 of PCT/CN2017/099860 filed on Aug. 31, 2017, and claims priority to Chinese Patent Application No. CN 201610793832.2, entitled "DEVICE INTEGRATING A JUNCTION FIELD EFFECT TRANSISTOR AND MANUFACTURING METHOD THEREFOR" filed on Aug. 31, 2016. The entire contents of each application are hereby incorporated by reference.

TECHNICAL FIELD

The present disclosure relates to a semiconductor manufacturing technique, and more particularly to a device integrated with a junction field-effect transistor and a method for manufacturing a device integrated with a junction field-effect transistor.

BACKGROUND

At present, integrating a high-voltage Junction Field-Effect Transistor (JFET) on a high-voltage process platform is an advanced development and conception in the field of smart power integrated circuits, which can greatly improve the on-state performance of longitudinal power devices and significantly reduce the chip area, and is in line with the mainstream trend of manufacturing a smart power device nowadays.

A high-voltage integrated JFET of the conventional structure can be implemented by a simpler process, but instability of the pinch-off voltage thereof limits its large-scale application in the field of smart power integration.

For a conventional Vertical Double-diffused Metal-Oxide-Semiconductor Field-Effect Transistor (VDMOS) of an integrated high-voltage Junction Field-Effect Transistor (JFET), when the VDMOS is in the on-stage, the current flows through the JFET from the bottom drain and out of source2. When source2 is applied with a gradually increasing voltage Vg2 and simultaneously the same voltage Vg1 is applied to the gate, and when the Vg2>the pinch-off voltage Voff, the depletion layer of the JFET blocks the current, i.e., pinch-off occurs. At the moment, Vg1>Vth, Vth is the threshold voltage of VDMOS, and VDMOS is turned on, then a turning-on process is completed. Here, the JFET absorbs the abrupt current of the VDMOS on the Miller platform, which makes the startup more gradual, and the current can be approximately linearly transformed. Therefore, the JFET has a significant effect on improvement of stability of devices during the startup process. Power devices are integrated with the parasitic JFETs on their technology platform and have more advantages.

The most important characteristics of the integrated parasitic JFET are stability of overall breakdown voltage and stability of pinch-off voltage. Ideally, the breakdown voltage of the device remains constant after integration, and the breakdown point is preferably maintained as the breakdown point of the VDMOS power device. The joint of the conventional integrated structure VDMOS and JFET is only isolated by a substrate, and can only extend the lateral distance of the substrate epitaxy to ensure the margin when depleted, which will increase the area of the entire die. At the same time, due to the deviation of the epitaxial layer specification, a slight change in technology will cause transfer of the breakdown point. The breakdown point will be transferred from the cell region within the body to the JFET region or the joint, greatly reducing the stability of the breakdown, and also creep deformation of the breakdown voltage may occur. Conventional structures generally use a self-aligned P-type implanted substrate as a P-type pinch-off substrate. Since the P-type substrate of the cell region of the VDMOS has a very shallow longitudinal junction depth, generally only 3 to 5 µm, thus the longitudinal channel of the JFET is very short, and it is impossible to adjust the longitudinal channel length, so the pinch-off voltage is very unstable. It can be seen from simulation that when the drain voltage is changed from 50V to 100V, the pinch-off voltage Voff will be increased from 11V to 20V. However, in the practical application, Voff is required to be stable, so the conventional structure is difficult to meet the actual requirement.

SUMMARY

A device integrated with a junction field effect transistor and a method for manufacturing the device are provided according to each of the embodiments of the present disclosure.

A device integrated with a junction field-effect transistor (JFET) is provided, the device is divided into a JFET region and a power device region, the device includes: a drain having a first conduction type, while a portion of the drain being located in the JFET region and the other portion of the drain being located in the power device region; and a first conduction type region disposed on a front face of the drain, while a portion of the first conduction type region being located in the JFET region, and the other portion of the first conduction type region being located in the power device region; the JFET region further includes: a JFET source having the first conduction type; a first well having a second conduction type, which is disposed within the first conduction type region and formed at both sides of the JFET source, while the first conduction type is opposite to the second conduction type; a metal electrode formed on the JFET source, which is in contact with the JFET source; a JFET metal gate disposed on the first well of the both sides of the JFET source; and a first clamping region located below the JFET metal gate and within the first well, which is of the second conduction type and has an ion concentration greater than that of the first well.

A method for manufacturing a device integrated with a Junction Field-Effect Transistor (JFET) is provided, the device includes a JFET region and a power device region, the method comprising: providing a substrate of a first conduction type on which a first conduction type region is formed, while the first conduction type is opposite to a second conduction type; implanting ions of the second conduction type into the first conduction type region and forming a first well within the first conduction type region by driving-in; growing a field oxide layer and a gate oxide layer on a surface of the first conduction type region in sequence, forming a polysilicon layer on the surface of the first conduction type region, and implanting ions of the second conduction type into the first conduction type region of the power device region and forming a plurality of second wells by driving-in; implanting ions of the first conduction type into the second well of the power device region to form a power device source; implanting ions of the first conduction type between two adjacent second wells of the JFET region to form a JFET source; photoetching and etching a contact hole, implanting ions of the second conduction type into the contact hole, to form a clamping region within the first well and at a bottom of the second well, while an ion concentration of the clamping region is greater than that of the first well; and depositing a metal layer and filling the contact hole with the metal layer to form a metal electrode of the JFET source, a JFET metal gate and a metal contact of the power device source respectively.

Details of one or more embodiments of the disclosure are set forth in the accompanying drawings and description as follows. Other features, objectives and advantages of the disclosure will be apparent from the description, drawings and claims.

BRIEF DESCRIPTION OF DRAWINGS

In order to make the technical solutions in embodiments of the present disclosure or prior art more clearly, drawings needed in illustration of embodiments will be briefly introduced as follows. Apparently, the following described drawings are only some embodiments of the present disclosure, and it is possible for those skilled in the art to obtain drawings of other embodiments according to these drawings without any creative work.

DETAILED DESCRIPTION OF DISCLOSED EMBODIMENTS

Figure 1:
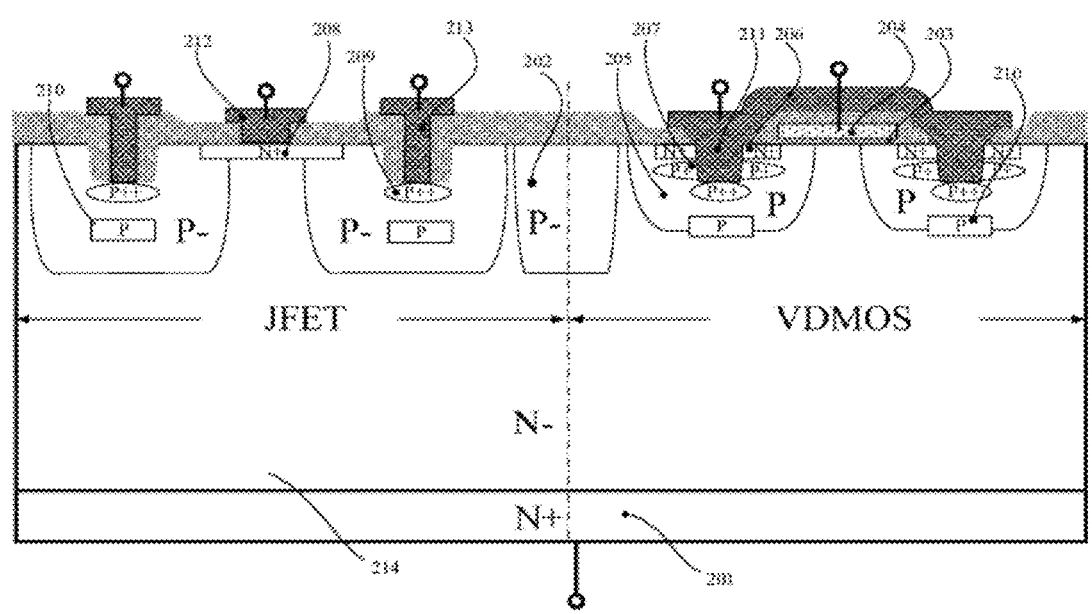
FIG. 1 is a sectional schematic diagram of a device integrated with a junction field effect transistor according to an embodiment of the present disclosure.

In order to facilitate the understanding of the present disclosure, the present disclosure will be detailed hereinafter with reference to the accompanying drawings. Preferred embodiments of the disclosure are given in the drawings. However, the disclosure may be implemented in many different forms and is not limited to the embodiments described herein. On the contrary, the purpose of providing these embodiments is to make the disclosure more thorough and comprehensive.

Unless otherwise defined, all technical and scientific terms used herein have the same meaning as commonly understood by those skilled in the art belonging to the technical field of the disclosure. The terms used in the description of the present disclosure are for the purpose of describing specific embodiments and is not intended to limit the disclosure. The term "and/or" used herein includes any and all combinations of one or more of the associated listed items.

It should be noted that when an element is referred to as being "fixed" to another element, the element can be directly on the other element or there may be a mediate element. When an element is referred to as "connected" to another element, the element can be directly connected to the other element or there may be a mediate element simultaneously.

The terms "vertical", "horizontal", "upper", "lower", "left", "right", and the like, as used herein, are used for purpose of illustration only.

The vocabulary of the semiconductor field used herein is a technical vocabulary commonly used by those skilled in the art, for example, for P type and N type impurities, in order to distinguish the doping concentration, simply, P+ type is taken to represent a P type of heavy doping concentration, P type is taken to represent P type of moderate doping concentration, P− type is taken to represent P type of mild doping concentration, N+ type is taken to represent N type of heavy doping concentration, N type is taken to represent N type of moderate doping concentration, and N− type is taken to represent N type of mild doping concentration.

FIG. 1 is a sectional schematic diagram of a device integrated with a junction field effect transistor according to an embodiment. In this embodiment, an N type is defined as a first conduction type, a P type is a second conduction type, and a power device is a VDMOS. As shown in FIG. 1, the device is divided into a JFET region and a VDMOS region according to the structure, and a portion of an N type drain 201 disposed on the back face of the device (i.e., the surface facing downward in FIG. 1) is configured to form a JFET region and the other portion thereof is configured to form a VDMOS region. Similarly, a portion of an N type region 214 disposed on the front face of the drain 201 (i.e., the surface facing upward in FIG. 1) is configured to form the JFET region and the other portion thereof is configured to form the VDMOS region. In the present embodiment, the drain 201 is an N+ drain, and the N type region 214 is an N− epitaxial layer as a drift region of the VDMOS (in other embodiments, an N type substrate can also be used directly).

In the present embodiment, the JFET region includes a JFET source 208, a metal electrode 212 of the JFET source, a JFET metal gate 213, a first well 202, and a clamping region 210.

The P− first well 202 is disposed within the N type region 214 and is formed at both sides of the N+ JFET source 208. In the embodiment shown in FIG. 1, the JFET source 208 extends into the JFET sources 208 at both sides. A metal electrode 212 of the JFET source is formed on the JFET source 208 and in contact with the JFET source 208. The JFET metal gate 213 is disposed on the first wells 202 at both sides of JFET source 208. The clamping region 210 of P type is located below the JFET metal gate 213, within the first well 202, and has an ion concentration greater than that of the first well 202.

The device integrated with the junction field effect transistor improves the ion concentration of the first well 202 through the clamping region 210, enhances the depletion ability of the channel region, such that the JFET pinch-off voltage stability is improved to some extent. At the same time, the presence of the clamping region 210 enhances the electric field strength at that location, changes the path of the avalanche current, and improves the stability of the device.

The clamping region 210 employs high energy during the P type ion implantation to achieve sufficient implantation depth. In one of the embodiments, the implantation energy is about 480 keV. The clamping region 210 is capable of solidifying the breakdown point.

In the embodiment as shown in FIG. 1, a first well 202 is formed at the boundary between the JFET region and the VDMOS region, as an isolation well, to isolate the JFET region from the VDMOS region. The P− first well 202 is used for assisting the depletion isolation. The current flow path can be completely blocked through the isolation of the deeper first well 202, electric leakage between the JFET and the VDMOS is prevented, the lower N− epitaxial layer (i.e., the N type region 214) can be assisted to participate in depletion when the device is biased reversely and can withstand voltage, and the breakdown voltage of local region is boosted to serve for solidifying the breakdown point. At the same time, the first well 202, serving as a depletion structure of a terminal in the junction terminal extension technique, can effectively shorten the chip area of the high voltage VDMOS. In addition, due to the presence of the junction process of the junction terminal extension, the junction depth of the P− well greatly exceeds the junction depth of the P type substrate of the VDMOS in the conventional art, thus a longer longitudinal current channel forms. Compared with the conventional structure, the stability of the pinch-off voltage of the device is increased more, and the pinch-off voltage is also significantly reduced. In one of the embodiments, the well depth of the first well 202 is between 8.5 microns and 13.5 microns.

In the embodiment as shown in FIG. 1, the VDMOS region includes a gate (the gate includes a gate oxide layer 203 and a polysilicon gate 204), a second well 205, and an N+ VDMOS source 206 disposed within the second well 205; and the VDMOS region also includes a clamping region 210 of the P type disposed at the bottom of the second well 205.

In the embodiment as shown in FIG. 1, a trench is formed within the second well 205 of the VDMOS region and the first well 202 of the JFET region. The VDMOS region is provided with a metal contact 211 of the VDMOS source, and an ohmic contact region 209 of the P type is formed at a place in contact with the bottom of the trench within each of the second wells 205, and a place in contact with the bottom of the trench within each of the first wells 202. The metal contact 211 of the VDMOS source is filled into the trench of the VDMOS region, penetrates the VDMOS source downward and extends to the ohmic contact region 209. The JFET metal gate 213 is filled into the trench of the JFET region and extends down to the ohmic contact region 209. The ion concentration of the ohmic contact region 209 is greater than that of the second well 205.

In the embodiment as shown in FIG. 1, an Unclamped Inductive Switching (UIS) region 207 of the P type is formed between the VDMOS source 206 and the ohmic contact region 209 within the second well 205 of the VDMOS region. The ion concentration of the UIS region 207 is greater than that of the second well 205.

Figure 2:
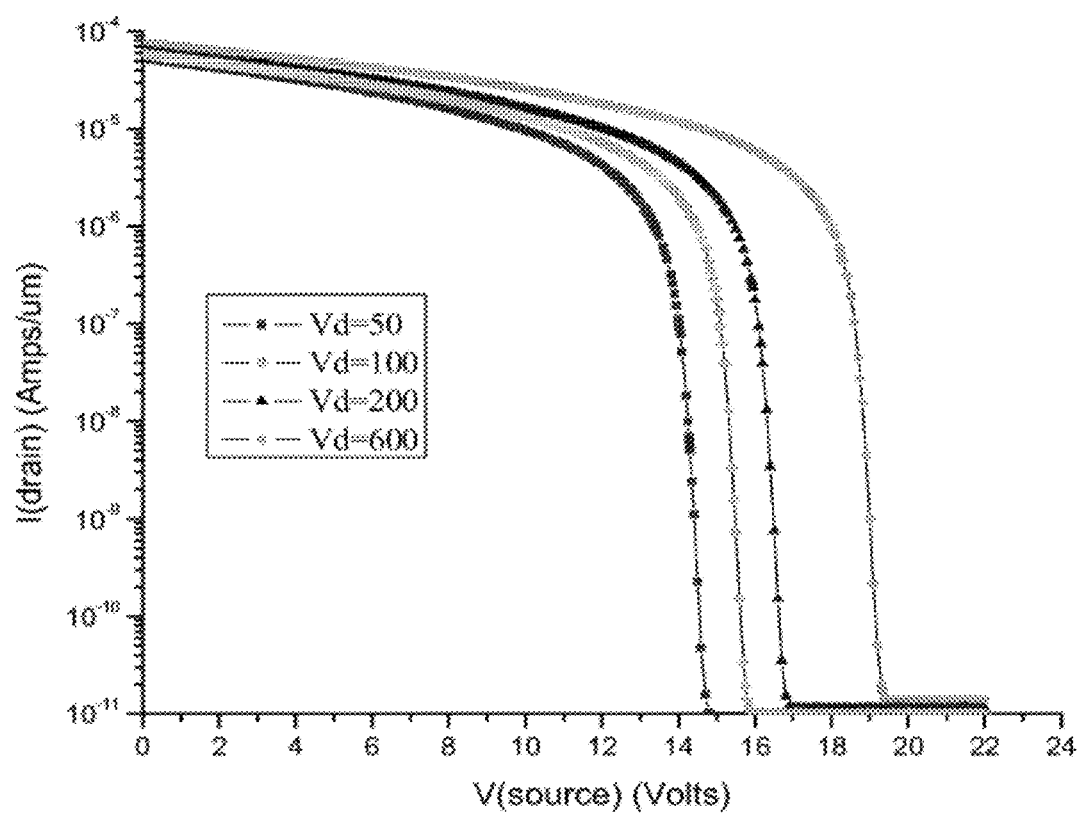
FIG. 2 is comparison curve diagram of pinch-off voltages of the device shown in FIG. 1 under different drain voltages Vd obtained by simulation.

FIG. 2 is a comparison curve diagram of pinch-off voltages of the device shown in FIG. 1 under different drain voltages Vd obtained by simulation, with the abscissa denotes the source voltage and the ordinate denotes the drain current. Simulation is performed under different drain voltages Vd through the SILVACO software, and change of the pinch-off voltage when the drain voltage Vd is 50V, 100V, 200V, and 600V respectively can be seen. The change of the pinch-off voltage is maintained at a linear change of about 0.5V when the drain voltage Vd varies from 50V to 200V. When the drain voltage Vd is boosted to 600V, the pinch-off voltage is increased by 5V. This is due to the thermal model addition, current carriers in the device are in a higher temperature at a high voltage, the momentum of current carriers is increased, the movement rate of current carriers is accelerated, the number of charge passing through a cross-section per unit time is increased, and current is increased, so the current increases when pinched off, this is a normal phenomenon. The simulation in FIG. 4 is for a device with a breakdown voltage 650V. The above-mentioned junction field effect transistor substantially achieves the controllable pinch-off voltage within the range of normal use. The above-mentioned junction field effect transistor also applies to an ultrahigh voltage device with thickened epitaxial layer, as well as the trench gate devices of low voltage.

The main advantage of the above-mentioned device integrated with a junction field effect transistor lies in improving the stability of the original integrated JFET channel pinch-off. With the characteristic of its deeper longitudinal channel, the influence of the drain voltage Vd on the source surface potential is reduced, and the stability of the pinch-off voltage is improved, so the increase of the junction depth is one of the key points of the structure of the present disclosure. The first well 202 acts as a junction termination extension ring of the VDMOS at the same time. The deepest depth is limited by its termination technique, but at this point the depth required by the P-well of the depletion type JFET is greatly exceeded, so these two are compatible.

Figure 3:
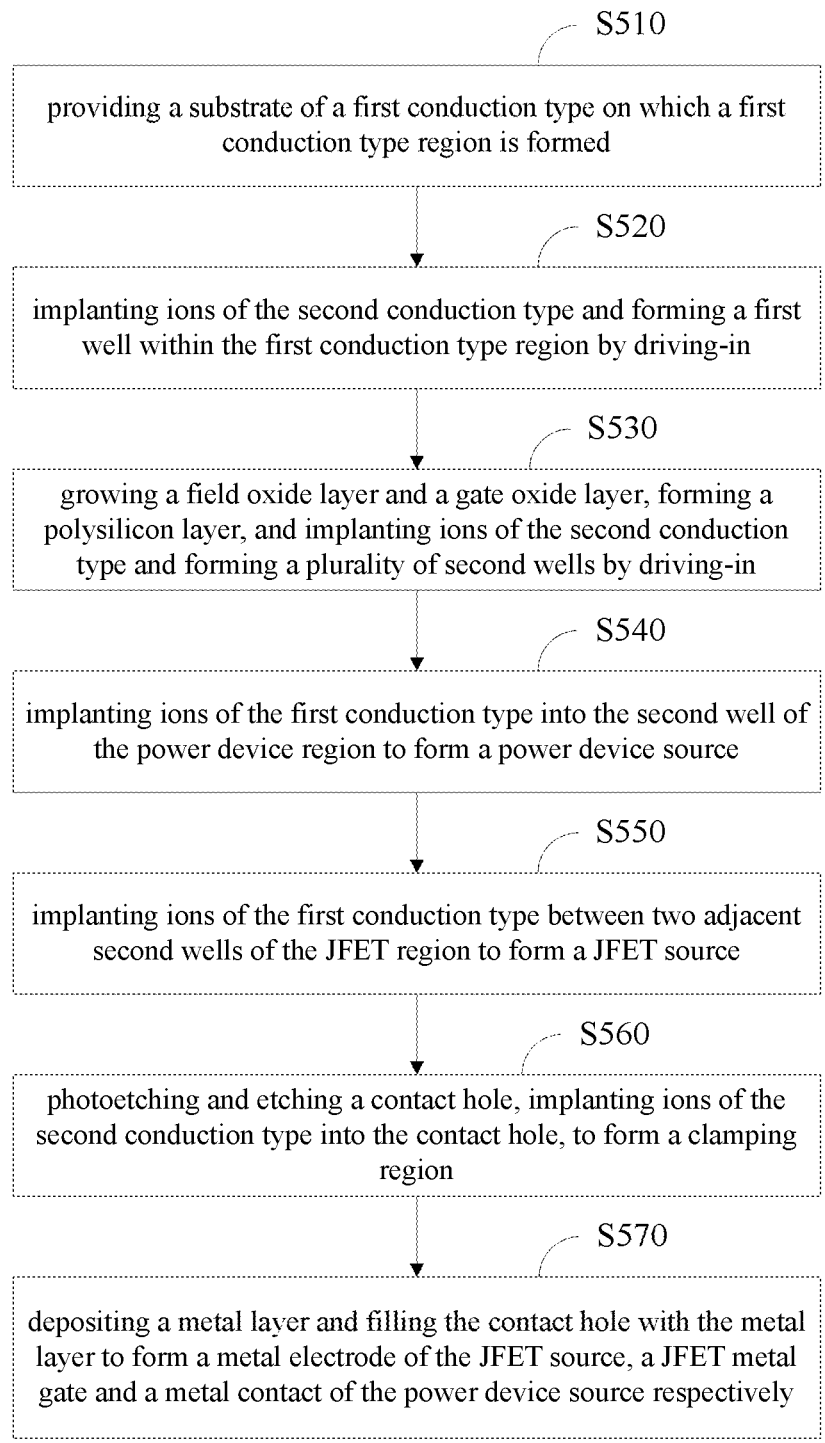
FIG. 3 is a flow chart showing a method for manufacturing a device integrated with a junction field effect transistor according to an embodiment of the present disclosure.

FIG. 3 is a flow chart of a method for manufacturing a device integrated with a junction field-effect transistor according to an embodiment. The following is an example in which the power device is VDMOS, the first conduction type is the N type, and the second conduction type is the P type, introducing the method for manufacturing the device integrated with the junction field effect transistor.

At Step S510, a substrate of a first conduction type is provided on which a first conduction type region is formed.

In this embodiment, an N type region 214 is epitaxially formed on the N+ substrate, and subsequently the substrate will serve as a drain 201 of the device.

At Step S520, ions of the second conduction type are implanted and a first well in the first conduction type region is formed by driving-in.

Figure 4A:
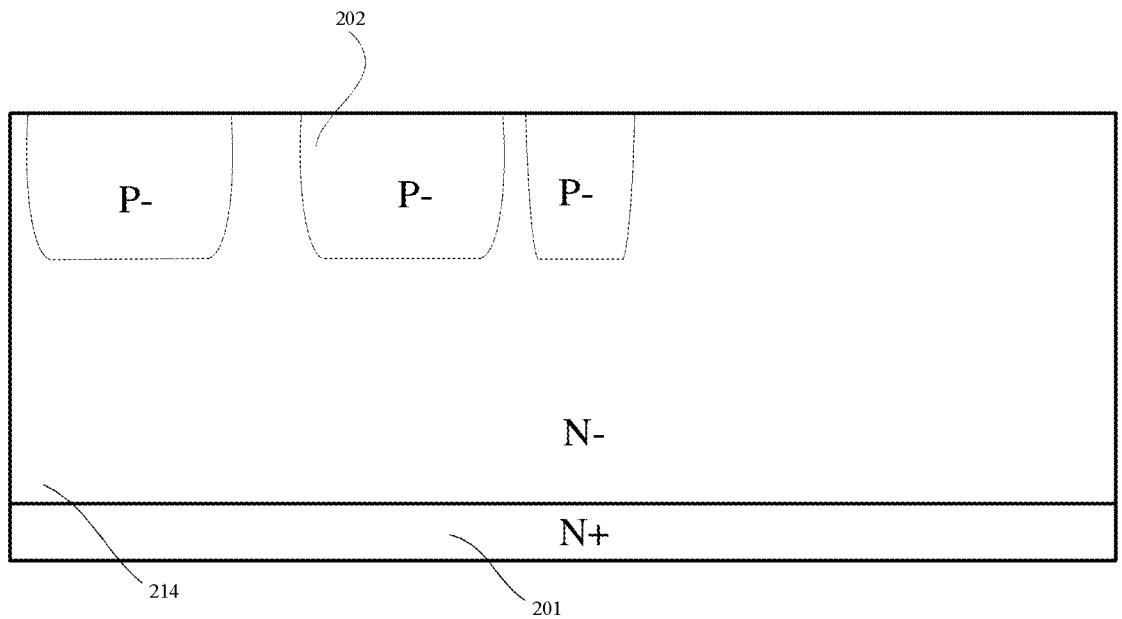
FIGS. 4a-4e are sectional schematic diagrams of the manufacturing method shown in FIG. 2 during a process of manufacturing a device.

In the present embodiment, P type ions are implanted into the N type region 214 and the first well 202 is formed within the N type region 214 by driving-in. FIG. 4a is a sectional schematic diagram of the device after the step S520 is completed.

At Step S530, a field oxide layer and a gate oxide layer are grown, a polysilicon layer is formed, ions of the second conduction type are implanted and a plurality of second wells are formed by driving-in.

Figure 4B:
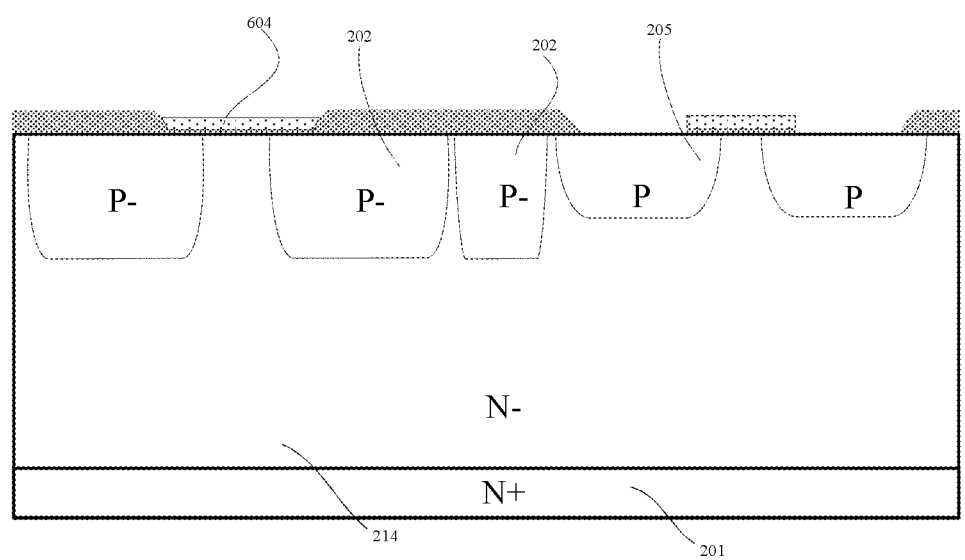

A thick field oxide layer is grown on the surface of the N type region 214, then a gate oxide layer is grown, a polysilicon layer 604 is formed on the surface of the N type region 214, the N type region 214 is implanted with P type ions by serving the field oxide layer and the polysilicon layer 604 as a mask, and a plurality of second wells 205 are formed by driving-in. The ion concentration of the second well 205 is greater than that of the first well 202. FIG. 4b is a sectional schematic diagram of the device after the step S530 is completed.

At Step S540, ions of the first conduction type are implanted into the second well of the power device region to form a source of the power device.

N type ions are implanted into the second well 205 of the VDMOS region to form a VDMOS source 206.

Figure 4C:
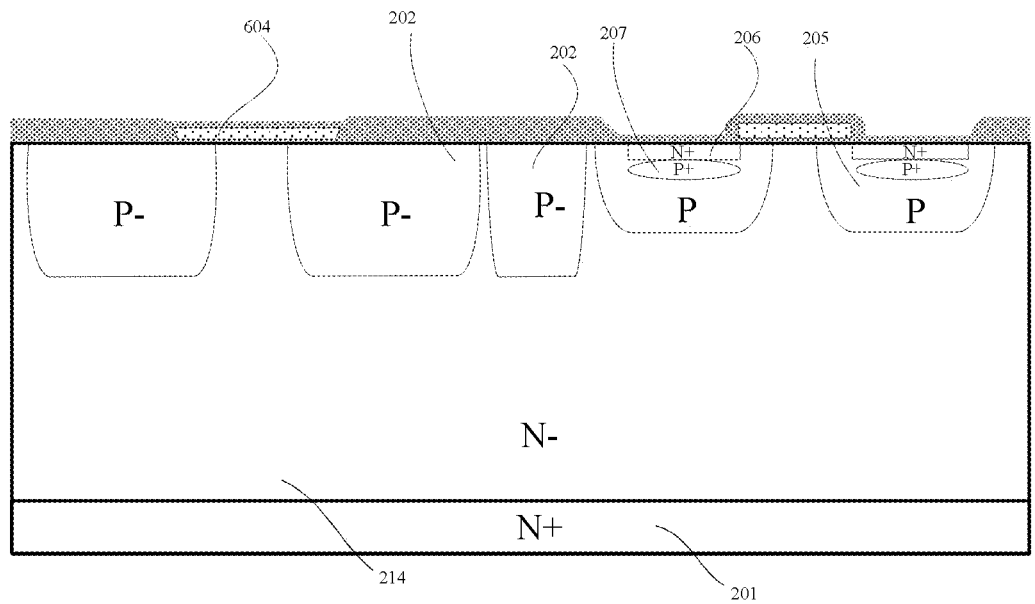

Referring to FIG. 4c, in the embodiment, after the step of implanting N type ions to form the VDMOS source 206, the method further includes the step of implanting P type ions into the second well 205 of the power device region to form a UIS region 207 below the VDMOS source 206 within the second well 205. In order to prevent the P type ions implanted into the second well 205 from adversely affecting the channel region, before the step of implanting P-type ions to form a UIS region 207, the method further includes a step of forming an implantation barrier layer. In the present embodiment, the implantation barrier layer is formed by forming another oxide layer. Since the oxide layer at an implantation window where the P type ions are implanted to form the UIS region 207 is thinner, the high-energy implanted P-type ions can pass through the oxide layer to form the UIS region 207. The oxide layer at other positions is formed on the structure such as the field oxide layer, the polysilicon layer 604, etc., so that the entire implantation barrier layer is thicker, and it is difficult for the P-type ions to pass through the implantation barrier layer into the N type region 214.

At S550, ions of the first conduction type are implanted between two adjacent second wells of the JFET region to form a JFET source.

Figure 4D:
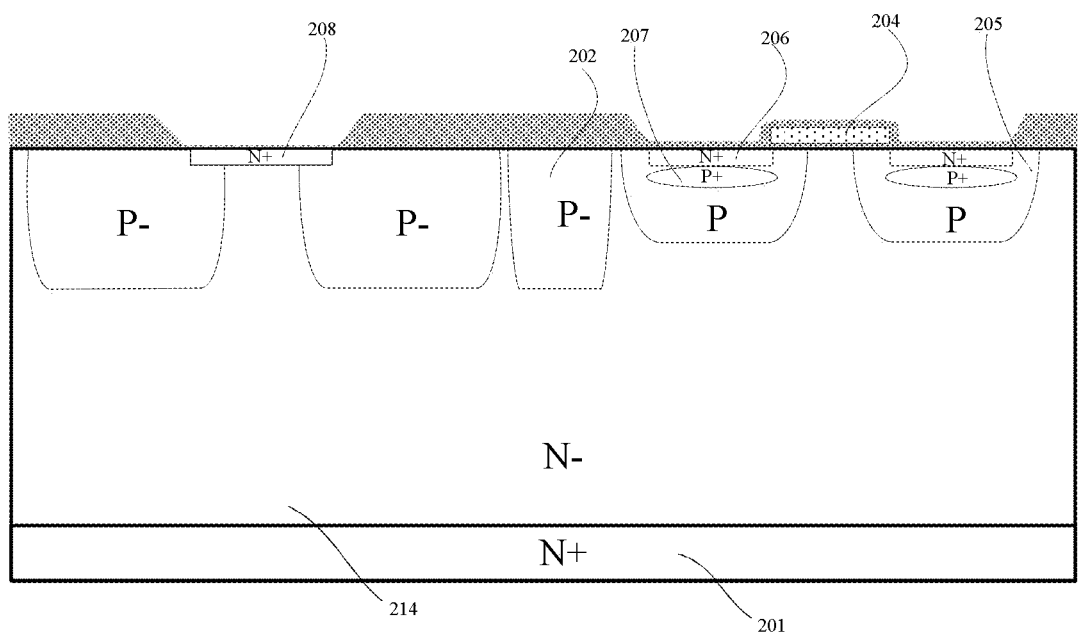

In the present embodiment, the dielectric and polysilicon layer 604 above the JFET source 208 is removed by photoetching and etching, and then N type impurities are implanted to form a JFET source 208 on the surface of the N type region 214. The redundant polysilicon layer 604 is removed to form the polysilicon gate 204 as shown in FIG. 4*d*. FIG. 4*d* is a sectional schematic diagram of the device after the step S550 is completed.

At S560, a contact hole is photoetched and etched, and ions of the second conduction type are implanted into the contact hole to form the clamping region.

Figure 4E:
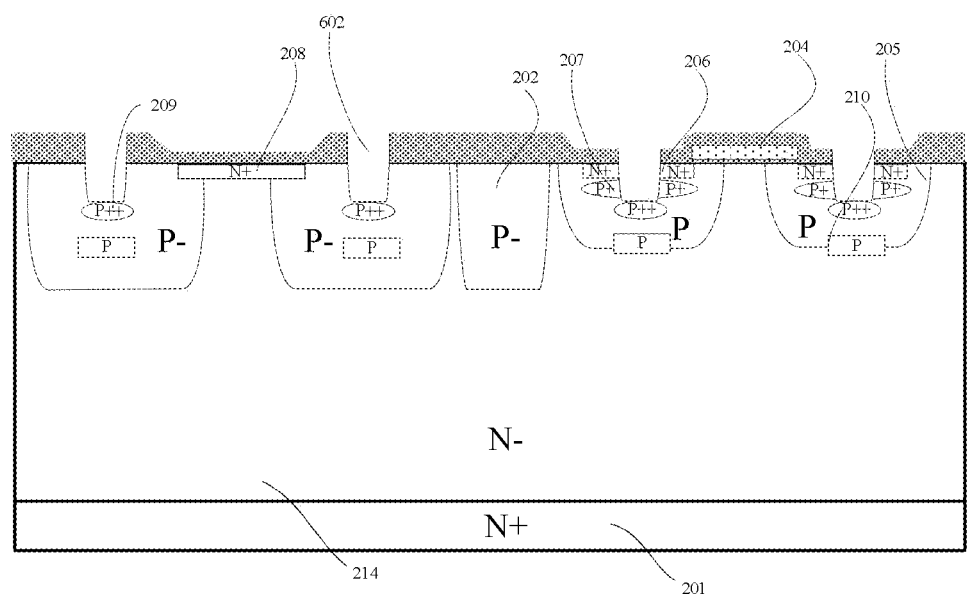

Referring to FIG. 4*e*, in the embodiment, before the step S560, the method further includes a step of etching a trench 602 in each of the second wells 205 and each of the first wells 202. The above step requires two separate implantations of the P type ions into the second well 205. The first implantation forms each P++ type ohmic contact region 209 at each place in contact with the bottom of the trench 602 within the second wells 205 at both sides of the gate, and at each place in contact with the bottom of the trench 602 within the first wells 202 at both sides of the source 208; the second implantation forms the P type clamping regions 210 at the bottoms of the second wells 205 at both sides of the gate and within the first wells 202 at both sides of the source 208.

At S570, a metal layer is deposited and is filled into the contact holes to form a metal electrode of the JFET source, the JFET metal gate and a metal contact of the power device source respectively.

The deposited metal layer is filled into the trenches 602 within the second wells 205 of the JFET region to form JFET metal gates 213, and filled into the trenches 602 within the second wells 205 of the power device region to form metal contacts 211 of the VDMOS source. A passivation layer is formed on the surface of the device after depositing the metal layer, and the section of the completed device is provided as shown in FIG. 1.

In one of the embodiments, the implantation forming the P type clamping region 210 is a high-energy P type implantation, while the implantation energy is about 480 keV.

A deep trench (trench 602) plus P++ implantation (forming the UIS region 207) is introduced in the VDMOS portion with a purpose to improve the UIS characteristics of the VDMOS device. In the conventional high-voltage VDMOS technology, the UIS capability of the device is enhanced by UIS implantation, but limited by the implantation depth and concentration dispersion, so the effect is not satisfied. The deep trench etches the cell region of the VDMOS, removes redundant N type impurities, and implants P type ions intensively, thereby increasing the electron bleed path during the UIS process and greatly enhancing the UIS capability of the device.

In the above method for manufacturing the device integrated with the junction field effect transistor, the second well 205 in the device may be a P type substrate of a cell region in the VDMOS, but the concentration of the P type substrate is limited by the cell design parameter in the VDMOS, and thus a photoetching dedicated to adjust the second well 205 is further needed to add in the case of requiring precise adjustment. This photoetching is compatible with the DMOS technology, so the total number of photoetching layers in the entire technology is constant.

Combining the above advantages, the above-mentioned device integrated with the junction field-effect transistor improves the stability of the pinch-off voltage on the basis of the conventional technique, solidifies the breakdown point, strengthens the UIS capability, perfectly matches the technology, and realizes the adjustability of the pinch-off voltage.

In one of the embodiments, the step S520 includes forming one first well 202 as an isolation well at the boundary between the JFET region and the power device region, to isolate the JFET region from the power device region.

In one of the embodiments, the implantation concentration of the first well 202 at the step S520 is from 1.5E13 $cm^{-2}$ to 2.2E13 $cm^{-2}$, and the well depth of the formed first well 202 is from 8.5 microns to 13.5 microns.

The above-mentioned embodiments are merely illustrative of several embodiments of the present disclosure, and the description thereof is more specific and detailed, but is not understood as limiting the scope of the disclosure. It should be noted that a number of variations and modifications may be made by those skilled in the art without departing from the spirit of the disclosure, and these variations and modifications also belong to the scope of the disclosure. Therefore, the scope of the disclosure should be subject to the appended claims.

What is claimed is:

1. A method for manufacturing a device integrated with a Junction Field-Effect Transistor (JFET), the device comprising a JFET region and a power device region, the method comprising:

providing a substrate of a first conduction type on which a first conduction type region is formed; while the first conduction type is opposite to a second conduction type;

implanting ions of the second conduction type into the first conduction type region and forming a first well within the first conduction type region by driving-in;

growing a field oxide layer and a gate oxide layer on a surface of the first conduction type region in sequence, forming a polysilicon layer on the surface of the first conduction type region, and implanting ions of the second conduction type into the first conduction type region of the power device region and forming a plurality of second wells by driving-in;

implanting ions of the first conduction type into the second well of the power device region to form a power device source;

implanting ions of the first conduction type between two adjacent second wells of the JFET region to form a JFET source;

photoetching and etching a contact hole, implanting ions of the second conduction type into the contact hole, to form a clamping region within the first well and at a bottom of the second well, wherein an ion concentration of the clamping region is greater than that of the first well; and depositing a metal layer and filling the contact hole with the metal layer to form a metal electrode of the JFET source, a JFET metal gate and a metal contact of the power device source respectively.

2. The method according to claim 1, wherein a step of forming an isolation well within the first conduction type region comprises: forming the isolation well at the boundary between the JFET region and the power device region, as isolation of the JFET region and the power device region.

3. The method according to claim 1, wherein in the step of implanting ions of the second conduction type into the first conduction type region and forming the plurality of second wells by driving-in, the implanting is carried out by serving the field oxide layer and the polysilicon layer as a mask.

4. The method according to claim 3, wherein between the step of forming the power device source and the step of forming the JFET source, further comprises a step of
   forming an implantation barrier layer which is also superposed onto surfaces of the field oxide layer and the polysilicon layer; and
   implanting ions of the second conduction type into the second well of the power device region to form an unclamped inductive switching region below the power device source within the second well, while an implantation energy is greater than that of the step of implanting ions of the first conduction type into the second well of the power device region, and the field oxide layer and the polysilicon layer superposed with the implantation barrier layer blocking the implanted ions of the second conduction type.

5. The method according to claim 1, wherein prior to the step of photoetching and etching the contact hole, further comprises:
   etching a trench in each of the first wells and each of the second wells, wherein the JFET metal gate is formed by a metal layer filled in the trench in the first well, and the metal contact of the power device source is formed by a metal layer filled in the trench in the second well.

6. The method according to claim 5, wherein after the step of etching the trench in each of the second wells, further comprises: implanting ions of the second conduction type into the trench, forming an ohmic contact region of the second conduction type at a place in contact with a bottom of the trench within each of the second wells and, and at a place in contact with a bottom of the trench within each of the first wells.

7. The method according to claim 6, wherein further comprises a step of re-implanting ions of the second conduction type, to form a clamping region of the second conduction type at a bottom of the second well and within the first well at both sides of the JFET source.

8. The method according to claim 7, wherein an implantation energy in the step of re-implanting ions of the second conduction type is 480 keV.

9. The method according to claim 1, wherein the first conduction type is an N type, the second conduction type is a P type, and the first conduction type region is an N type epitaxial layer.

10. The method according to claim 1, wherein the device is a Vertical Double-diffused Metal-Oxide-Semiconductor Field-Effect Transistor (VDMOS).

11. The method according to claim 1, wherein in the step of implanting ions of the second conduction type into the first conduction type region and driving-in, an implantation concentration is from 1.5E13 $cm^{-2}$ to 2.2E13 $cm^{-2}$;
   in the step of forming the first well in the first conduction type region, a well depth of the formed first well is from 8.5 micrometers to 13.5 micrometers.

* * * * *